US009438258B1

United States Patent
Yoo

(10) Patent No.: US 9,438,258 B1
(45) Date of Patent: *Sep. 6, 2016

(54) PREAMPLIFIER, COMPARATOR AND ANALOG-TO-DIGITAL CONVERTING APPARATUS INCLUDING THE SAME

(71) Applicant: SK hynix Inc., Gyeonggi-do (KR)

(72) Inventor: Si-Wook Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/816,955

(22) Filed: Aug. 3, 2015

(30) Foreign Application Priority Data

Mar. 9, 2015 (KR) .................. 10-2015-0032579

(51) Int. Cl.
| | | |
|---|---|---|
| *H03M 1/12* | (2006.01) | |
| *H03M 1/06* | (2006.01) | |
| *H03F 3/45* | (2006.01) | |
| *H03K 5/24* | (2006.01) | |
| *H03M 1/34* | (2006.01) | |

(52) U.S. Cl.
CPC ....... *H03M 1/0612* (2013.01); *H03F 3/45179* (2013.01); *H03K 5/2481* (2013.01); *H03M 1/1245* (2013.01); *H03M 1/34* (2013.01); *H03F 2200/312* (2013.01)

(58) Field of Classification Search
CPC ........ H03M 1/14; H03M 1/56; H03M 1/144; H03F 3/211; H03F 3/45071
USPC .................. 341/130–160; 330/252
See application file for complete search history.

(56) References Cited

U.S. PATENT DOCUMENTS

| | | | |
|---|---|---|---|
| 6,670,904 B1 | 12/2003 | Yakovlev | |
| 8,922,413 B1* | 12/2014 | Yoo | H03F 3/211 341/155 |
| 2003/0076172 A1* | 4/2003 | Tichauer | H03G 1/0017 330/285 |
| 2011/0200072 A1* | 8/2011 | Hong | H04W 72/0406 375/130 |
| 2014/0368371 A1* | 12/2014 | Yoo | H03F 3/211 341/156 |

FOREIGN PATENT DOCUMENTS

KR    1020100120749    11/2010

OTHER PUBLICATIONS

Lim, S., et al., A High-Speed CMOS Image Sensor With Column-Parallel Two-Step Single-Slope ADCs, IEEE Transactions on Electron Devices, Mar. 2009, pp. 393-398, vol. 56, No. 3.

* cited by examiner

*Primary Examiner* — Lam T Mai

(74) *Attorney, Agent, or Firm* — IP & T Group LLP

(57) ABSTRACT

A preamplifier may include: a common active load suitable for providing output impedance; an output polarity changing unit suitable for changing an output polarity of output nodes; a multi-differential input stage suitable for receiving an input voltage, a coarse ramping voltage, a fine ramping voltage and a common mode voltage, and sampling the common mode voltage and the coarse ramping voltage for amplification operations; and a coupling blocking unit suitable for blocking a coupling between the output nodes and input nodes that are included in the multi-differential input stage.

20 Claims, 6 Drawing Sheets

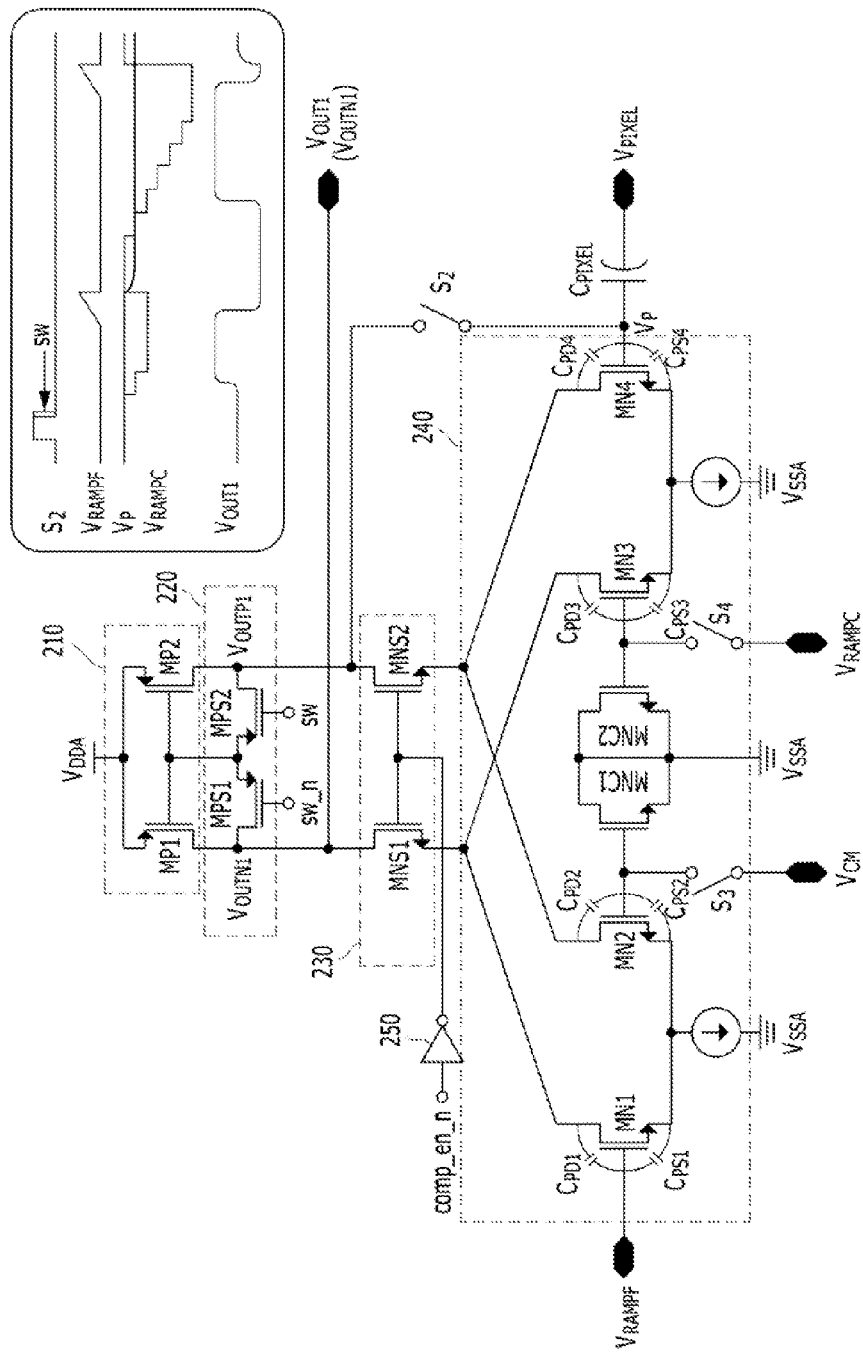

PREAMPLIFIER, COMPARATOR AND ANALOG-TO-DIGITAL CONVERTING APPARATUS INCLUDING THE SAME

CROSS-REFERENCE TO RELATED APPLICATIONS

The present application claims priority of Korean Patent Application No. 10-2015-0032579, filed on Mar. 9, 2015, which is incorporated herein by reference in its entirety.

BACKGROUND

1. Field

Various embodiments of the present invention relate to an electronic circuit design technology, and more particularly, to a preamplifier, and a comparator and an analog-to-digital converting apparatus including the same.

A two-step single-slope analog-to-digital converter (ADC) will be described as an example. However, embodiments of the present invention may be applied to a multi-step multi-slope ADC as well as a multi-step single-slope ADC, and may also be applied to a system requiring a high-speed multi-step single-slope ADC and a high-speed multi-step multi-slope ADC. Thus, the present invention is not limited to the two-step single-slope ADC.

2. Description of the Related Art

Methods for two-step (or multi-step) single-slope A/D conversion are disclosed in related art documents such as "Alexey Yakovlev, 'Double-Ramp ADC for CMOS Sensors' U.S. Pat. No. 6,670,904 B1, Dec. 30, 2003" and "Seunghyun Lim, 'A High-Speed CMOS Image Sensor with Column-Parallel Two-Step Single-Slope ADCs', IEEE Trans. Electron Devices, vol. 56, no. 3, pp. 393-398, March, 2009".

In the related arts, a coarse ramping voltage for most significant bit (MSB) conversion is stored in the top plate of a capacitor, an input terminal for fine ramping is coupled to the bottom plate of the capacitor during fine ramping for least significant bit (LSB) conversion, and then the voltage stored with a floating state in the top plate of the capacitor changes according to a fine ramping voltage.

The above-described related arts have a fundamental concern in that the slopes of the coarse ramping voltage and the fine ramping voltage which are inputted to a comparator during the coarse ramping and the fine ramping may differ depending on the conversion process.

In general, when a two-step single-slope analog-to-digital converter (ADC) is implemented, the preservability of input signals significantly influences the linearity of the ADC.

In a conventional ADC, however, change of an output node of a comparator may exert influence on signals stored in a floated input terminal of the comparator due to a coupling by overlap parasitic capacitance, thereby causing distortion. Such distortion may cause a linearity error of the ADC.

SUMMARY

Various embodiments are directed to a preamplifier that may preserve linearity by minimizing a coupling between output and input terminals, and a comparator and an analog-to-digital converting apparatus including the same.

In an embodiment, a preamplifier may include: a common active load suitable for providing output impedance; an output polarity changing unit suitable for changing an output polarity of output nodes; a multi-differential input stage suitable for receiving an input voltage, a coarse ramping voltage, a fine ramping voltage and a common mode voltage for differential amplification operations; and a coupling blocking unit suitable for blocking a coupling between the output nodes and the multi-differential input stage.

The preamplifier may further include an inverter suitable for inverting a comparator enable signal, and transmitting an inverted comparator enable signal to the coupling blocking unit.

The inverter may use the same voltage as a power supply voltage.

The output polarity changing unit may include first and second switches suitable for setting a first output as an output at a reset point, and changing the output from the first output to a second output before a comparison operation.

The output polarity changing unit may output a high state signal during coarse conversion, and output a low state signal during fine conversion.

The coupling blocking unit may include first and second cascode transistors that operate in a saturation region until the input voltage is compared.

The multi-differential input stage may sample a common mode voltage and a coarse ramping voltage based on a sampling control signal.

The sampled coarse ramping voltage and the sampled common mode voltage may have a differential relationship for the preamplifier.

In an embodiment, a comparator may include: a preamplifier suitable for blocking a coupling between output and input nodes by changing an output polarity of the output nodes, sampling a common mode voltage and a coarse ramping voltage based on a sampling control signal, generating a coarse conversion result through the output node by amplifying a difference between an input voltage and the sampled coarse ramping voltage, and generating a fine conversion result through the output nodes by amplifying a difference between a fine ramping voltage and the sampled common mode voltage; and a signal processor suitable for generating the sampling control signal based on the coarse conversion result, and generating a comparison signal based on the coarse conversion result and the fine conversion result.

The preamplifier may include: a common active load suitable for providing output impedance; an output polarity changing unit suitable for changing the output polarity of the output node; a multi-differential input stage suitable for receiving the input voltage, the coarse ramping voltage, the fine ramping voltage and the common mode voltage, and sampling the common mode voltage and the coarse ramping voltage; and a coupling blocking unit suitable for blocking the coupling between the output nodes and the multi-differential input stage.

The preamplifier may further include an inverter suitable for inverting a comparator enable signal, and transmitting the inverted comparator enable signal to the coupling blocking unit.

The inverter may use the same voltage as a power supply voltage.

The coupling blocking unit may include first and second switches suitable for setting a first output as an output at a reset point, and changing the output from the first output to a second output before a comparison operation.

The output polarity changing unit may output a high state signal during coarse conversion, and output a low state signal during fine conversion.

The coupling blocking unit may include first and second cascode transistors that operate in a saturation region until the input voltage is compared.

The sampled coarse ramping voltage and the sampled common mode voltage may have a differential relationship for the preamplifier.

The signal processor may include: an amplifier suitable for amplifying the coarse conversion result and the fine conversion result; a controller suitable for generating the sampling control signal based on the coarse conversion result; and a selector suitable for selecting the coarse conversion result through the controller and the fine conversion result from the amplifier based on a select signal to output the comparison signal.

The signal processor may include: a controller suitable for generating the sampling control signal based on the coarse conversion result; and a selector suitable for selecting the coarse conversion result through the controller and the fine conversion result from the preamplifier based on a select signal to output the comparison signal.

In an embodiment, an analog-to-digital converting apparatus may include: a preamplifier suitable for blocking a coupling between output and input nodes by changing an output polarity of the output nodes, sampling a common mode voltage and a coarse ramping voltage based on a sampling control signal, generating a coarse conversion result through the output nodes by amplifying a difference between an input voltage and the sampled coarse ramping voltage, and generating a fine conversion result through the output nodes by amplifying a difference between a fine ramping voltage and the sampled common mode voltage; a signal processor suitable for generating the sampling control signal based on the coarse conversion result, and generating a comparison signal based on the coarse conversion result and the fine conversion result; and a code decision unit suitable for deciding a coarse digital code and a fine digital code based on the comparison signal to output digital data.

The preamplifier may include: a common active load suitable for providing output impedance; an output polarity changing unit suitable for changing the output polarity of the output node; a multi-differential input stage suitable for receiving the input voltage, the coarse ramping voltage, the fine ramping voltage and the common mode voltage, and sampling the common mode voltage and the coarse ramping voltage; and a coupling blocking unit suitable for blocking the coupling between the output nodes and the multi-differential input stage.

BRIEF DESCRIPTION OF THE DRAWINGS

FIGS. 2C and 2D are detailed diagrams of a preamplifier.

DETAILED DESCRIPTION

Figure 1:
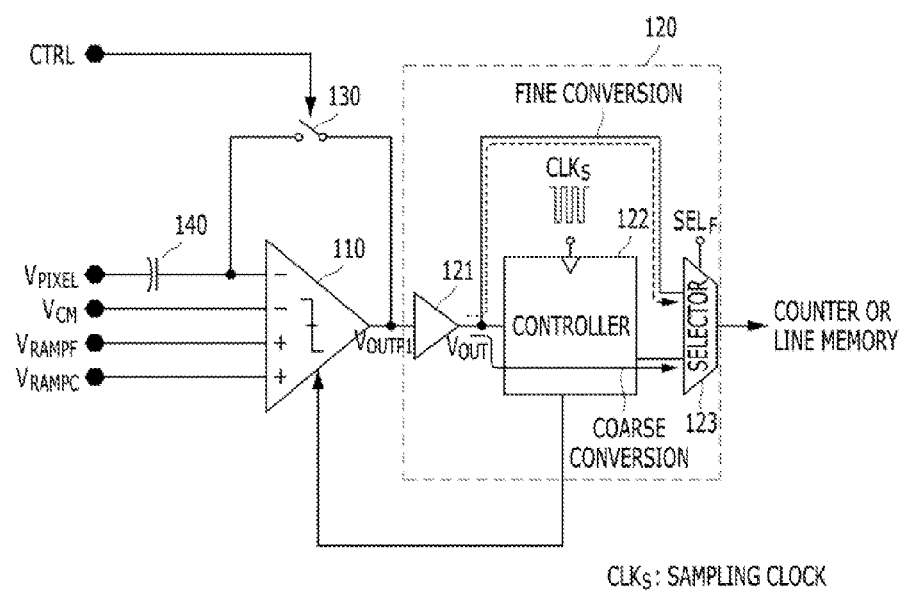
FIG. 1 is a block diagram illustrating a comparator in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

In this disclosure, when one part is referred to as being 'connected' to another part, it should be understood that the former can be 'directly connected' to the latter, or 'electrically connected' to the latter via an intervening part. Furthermore, when it is described that one comprises (or includes or has) some elements, it should be understood that it may comprise (or include or has) only those elements, or it may comprises (or includes or have) other elements as well as those elements if there is no specific limitation. The terms of a singular form may include plural forms unless stated otherwise.

FIG. 1 is a block diagram illustrating a comparator in accordance with an embodiment of the present invention.

As illustrated in FIG. 1, the comparator may include a preamplifier 110 and a signal processor 120. The preamplifier 110 may block a coupling between output and input terminals (or nodes) by changing the output polarity of an output node, output a coarse conversion result through the output node by amplifying a difference between an input voltage $V_{PIXEL}$ and a coarse ramping voltage $V_{RAMPC}$, and output a fine conversion result through an output node by amplifying a difference between a fine ramping voltage $V_{RAMPF}$ and a common mode voltage $V_{CM}$. The signal processor 120 may generate a sampling control signal according to the coarse conversion result from the preamplifier 110, output the generated sampling control signal to the preamplifier 110, and output a comparison signal based on the coarse conversion result and the fine conversion result from the preamplifier 110 to a counter or line memory.

The preamplifier 110 may sample the common mode voltage $V_{CM}$ and the coarse ramping voltage $V_{RAMPC}$ according to the sampling control signal from the signal processor 120. At this time, the preamplifier 110 may sample the common mode voltage $V_{CM}$ using a switch $S_3$ and a transistor MNC1, and sample the coarse ramping voltage $V_{RAMPC}$ using a switch $S_4$ and a transistor MNC2. The switches $S_3$ and $S_4$ may be turned on/off according to the sampling control signal from the signal processor 120. Furthermore, the sampled coarse ramping voltage and the sampled common mode voltage may have a differential relationship for the preamplifier 110.

The signal processor 120 may include an amplifier 121, a controller 122, and a selector 123. The amplifier 121 may amplify the coarse conversion result and the fine conversion result from the preamplifier 110. The controller 122 may generate a sampling control signal according to the coarse conversion result from the amplifier 121. The selector 123 may select the coarse conversion result from the controller 122 and the fine conversion result from the amplifier 121 according to a select signal $SEL_F$ which is received from a timing generator, for example, and output a comparison signal to the counter or line memory. The coarse conversion result may be transmitted to the selector 123 from the controller 122 in synchronization with a sampling clock $CLK_S$. The amplifier 121 is an additional component. In this case, the coarse conversion result from the preamplifier 110 may be transmitted to the controller 122, and the fine conversion result from the preamplifier 110 may be transmitted to the selector 123.

The comparator may further include a switch 130 for resetting the preamplifier 110 in response to a control signal CTRL. That is, the switch 130 may turn on/off an output voltage of the preamplifier 110, which is fed back to an input terminal for receiving an input voltage Vp, in response to the control signal CTRL from an external controller (not illustrated), and reset the preamplifier 110.

Furthermore, the comparator may further include a capacitor 140 for decoupling the input voltage $V_{PIXEL}$ to be A/D converted from the output voltage fed back from the preamplifier 110.

Figure 2A:
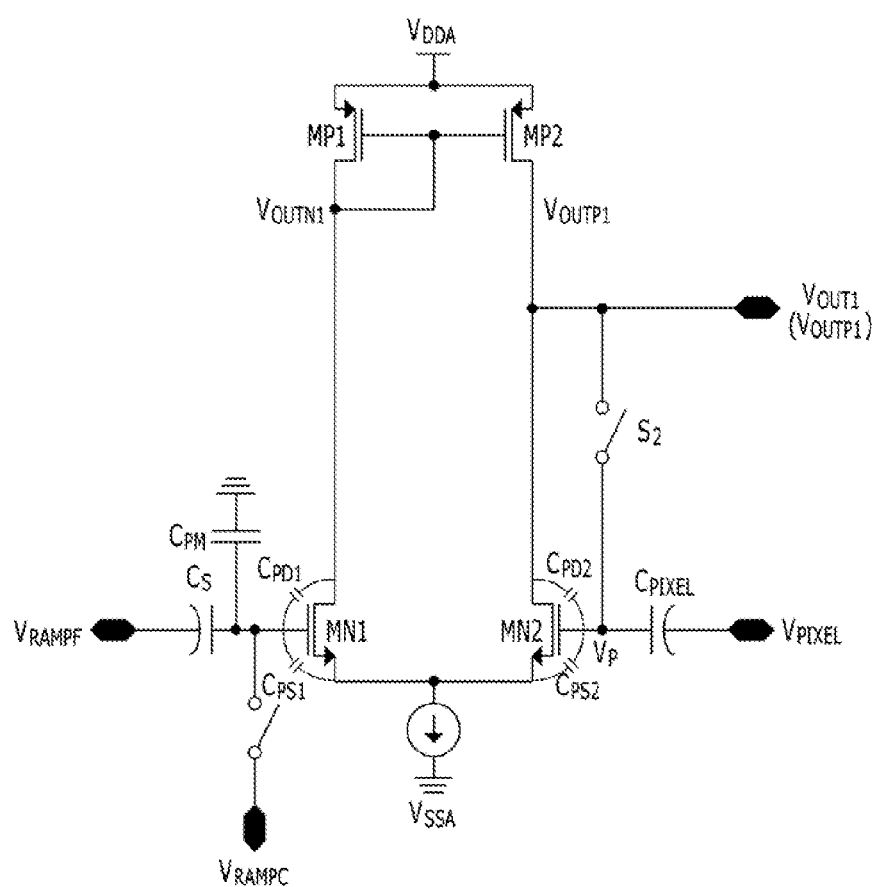
FIGS. 2A and 2B are diagrams illustrating a conventional preamplifier.
Figure 2B:
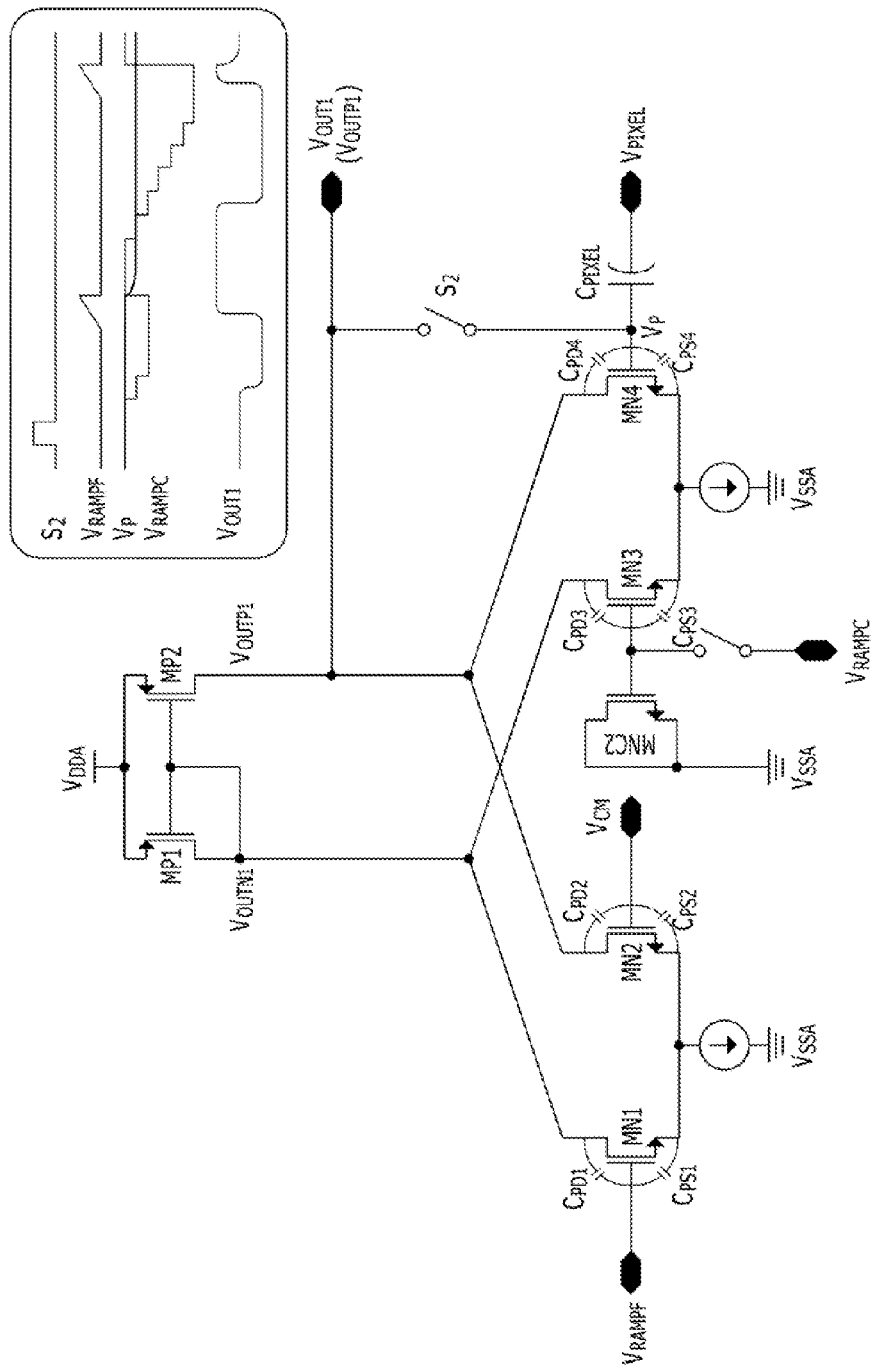

FIGS. 2A and 2B are diagrams illustrating a conventional preamplifier.

In the conventional preamplifiers illustrated in FIGS. 2A and 2B, both of first and second outputs Voutp1 and Voutn1 may cause a serious coupling at a floating node of an input unit. That is, a variation of the output voltages may have an influence on the input terminals. That is because the outputs and input terminals (or nodes) are directly coupled to an overlap parasitic capacitance Cpd formed between the drain node and the gate nodes of input transistors (MN1 and MN4 of FIG. 2A and MN1 to MN4 of FIG. 2B). Since the second output Voutn1 is configured in the form of diode connection, the variation of the output voltage is not so great in comparison to the first output Voutp1. However, since the second output Voutn1 has a direct coupling relation with the input terminals, the second output Voutn1 may cause distortion.

Figure 2C:
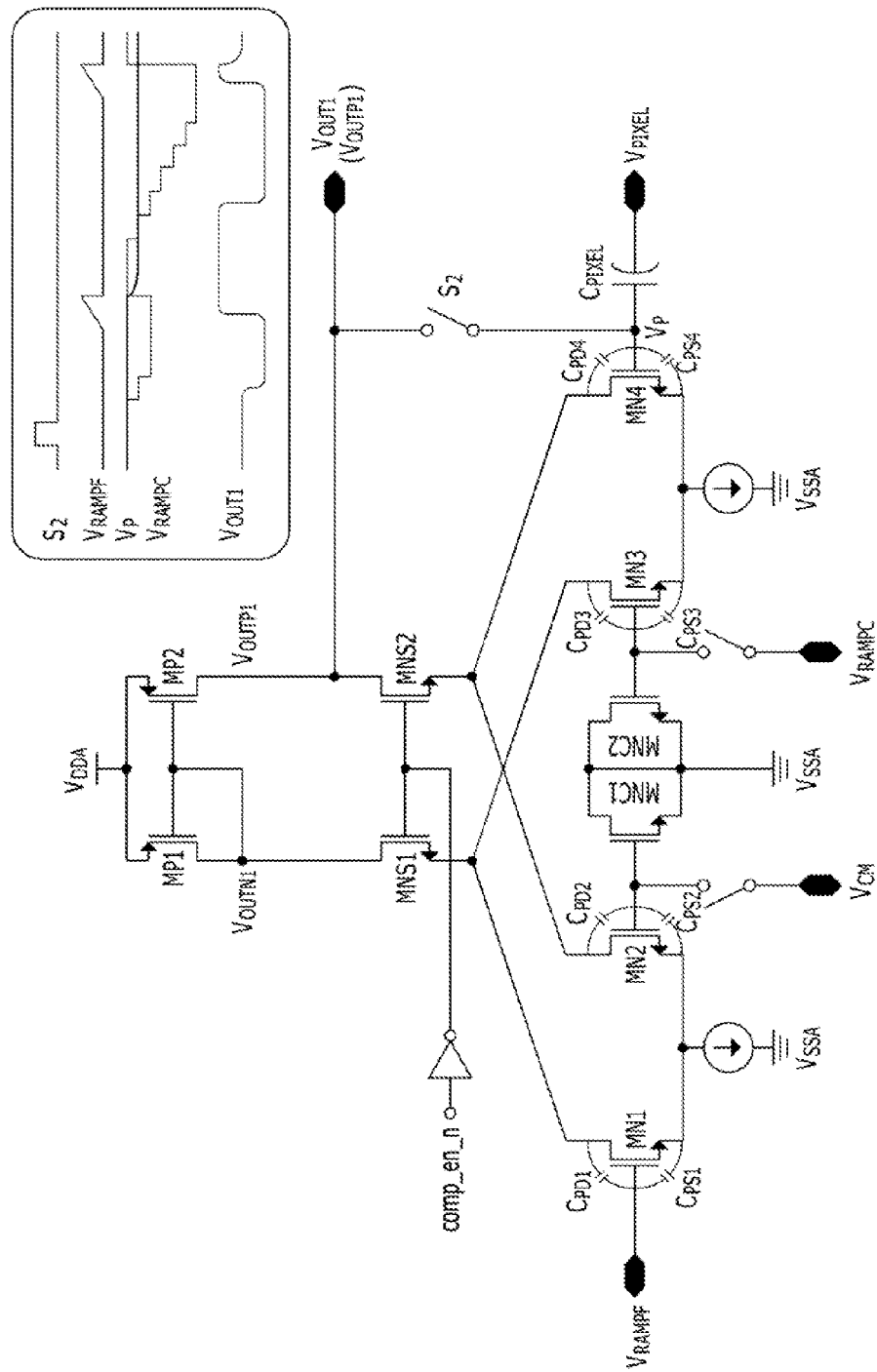

Therefore, in the embodiment of the present invention, cascode transistors MNS1 and MNS2 may be inserted between the input terminals and the output nodes of the comparator, to minimize a voltage change of the drain nodes of the input transistors of the comparator. In addition, even when the comparator compares inputs, the cascode transistors may maintain a saturation state at all times, thereby preventing the occurrence of a kickback to the input terminals. Thus, a coupling between output and input terminals may be effectively removed. FIGS. 2C and 2D are detailed diagrams of the preamplifier 110 shown in FIG. 1.

The preamplifiers illustrated in FIGS. 2C and 2D may include the cascode transistors MNS1 and MNS2, to minimize a coupling between output and input terminals (or nodes). An output voltage reduced by a gain of a common gate amplifier, which is generated by the cascode transistors MNS1 and MNS2, appears at the drain nodes of input transistors (MN1 to MN4 of FIGS. 2C and 2D) provided at each input terminal of a dual differential input stage. The cascode transistors MNS1 and MNS2 need to operate in the saturation region at all times. Otherwise, the cascade transistors MNS1 and MNS2 may operate as simple resistors, and thus the output nodes may be coupled to the input terminals.

In the preamplifier illustrated in FIG. 2C, the output Vout1 may transition to a low state during coarse conversion, and transition to a high state during fine conversion. In this case, since the cascode transistor MNS1 operates in the saturation region at all times, no concerns occur. However, when the cascade transistor MNS2 performs coarse conversion, the operation region may be changed from the saturation region to a triode region, and when the cascode transistor MNS2 performs fine conversion, the operation region may be changed from the triode region to the saturation region. Thus, a serious coupling may occur between output nodes and input terminals.

On the other hand, as illustrated in FIG. 2D, the output Vout1 of the preamplifier may transition to a high state during coarse conversion and transition to a low state during fine conversion, through output polarity changing switches MPS1 and MPS2. Thus, until inputs of the comparator are compared, the cascode transistor MNS2 may operate in the saturation region at all times, thereby removing a coupling between output and input terminals as much as possible. At this time, the cascode transistor MNS1 may operate in the saturation region during the coarse and fine conversions.

The operation timings of the output polarity changing switches MPS1 and MPS2 may be set as follows. First, when the comparator is reset, the first output Voutp1 may be set as an output to set an operating point of the input node Vp. Then, the output may be changed to the second output Voutn1 before A/D conversion, and subsequently the operation of the comparator may be performed.

As illustrated in FIG. 2D, the preamplifier may include a common active load 210, an output polarity changing unit 220, a coupling blocking unit 230, and a dual input differential pair (or a multi-differential input stage) 240. The common active load 210 may provide output impedance. The output polarity changing unit 220 may change the output polarity of an output node. The coupling blocking unit 230 may block a coupling between output and input terminals. The dual input differential pair 240 may receive the input voltage $V_{PIXEL}$, the coarse ramping voltage $V_{RAMPC}$, the fine ramping voltage $V_{RAMPF}$, and the common mode voltage $V_{CM}$, and sample the common mode voltage $V_{CM}$ and the coarse ramping voltage $V_{RAMPC}$ for amplification operations. The preamplifier may output a coarse conversion result through the output node by amplifying a difference between the input voltage $V_{PIXEL}$ and the coarse ramping voltage $V_{RAMPC}$, and output a fine conversion result through the output node by amplifying a difference between the fine ramping voltage $V_{RAMPF}$ and the common mode voltage $V_{CM}$.

The preamplifier may further include an inverter 250 for inverting a comparator enable signal comp_en_n and transmitting the inverted signal to the coupling blocking unit 230. The inverter 250 may use the same voltage as a power supply voltage VDDA to maintain a margin. The comparator enable signal comp_en_n may be received from an external controller, and transmitted to the gate nodes of the two cascode transistors MNS1 and MNS2 of the coupling blocking unit 230. Therefore, since the inverter 250 may block a current path through a switching operation of the two cascode transistors MNS1 and MNS2, the inverter 250 may be used for a current down function.

Referring to FIG. 2D, the configuration and operation of the preamplifier 110 will be described in more detail.

First, the output polarity changing unit 220 may include first and second switches MPS1 and MPS2 for setting the first output Voutp1 to an output at a reset point and changing the first output Voutp1 to the second output Voutn1 before a comparison operation. The first and second switches MPS1 and MPS2 may be implemented with PMOS transistors which are turned on/off according to switching control signals sw_n and sw from an external controller, for example, a timing generator.

The coupling blocking unit 230 may include the first and second cascode transistors MNS1 and MNS2 which operate in the saturation region until input voltages are compared to each other. The first and second cascode transistors MNS1 and MNS2 may be implemented with NMOS transistors.

Furthermore, an input differential pair (or differential input terminals) may be divided into multi-steps for coarse conversion and fine conversion. That is, the first and second transistors MN1 and MN2 may form a fine input differential pair for fine conversion, and the third and fourth transistors MN3 and MN4 may form a coarse input differential pair for coarse conversion.

The coarse input differential pair may directly receive the input voltage $V_{PIXEL}$ and the sampled coarse ramping voltage, and compare the received voltages. At this time, the coarse input differential pair may amplify a difference between the input voltage $V_{PIXEL}$ and the sampled coarse ramping voltage, and output a coarse conversion result to the signal processor 120 through the output terminal Voutn1. Such a coarse input differential pair may be referred to as a coarse input differential stage.

At this time, the input voltage $V_{PIXEL}$ to be A/D converted may be applied to the gate node of the fourth transistor of the coarse input differential pair, and the sampled coarse ramping voltage may be directly applied to the gate node of the third transistor.

On the other hand, the fine input differential pair may amplify a difference between the final ramping voltage $V_{RAMPF}$ and the sampled common mode voltage, and output a final conversion result to the signal processor 120 through the output terminal Voutn1. The common mode voltage from an external common mode voltage generator (not illustrated) may be used as a bias voltage, and the sampled common mode voltage may be set to the same voltage as the starting level of the fine ramping voltage $V_{RAMPF}$. Such a fine input differential pair may be referred to as a fine input differential stage.

At this time, the fine ramping voltage $V_{RAMPF}$ may be directly applied to the gate node of the first transistor of the fine input differential pair, and the sampled common mode voltage having the same level as the starting level of the fine ramping voltage $V_{RAMPF}$ may be directly applied to the gate node of the second transistor.

Since the differential amplification operations of the fine input differential pair and the coarse input differential pair are publicly known, the detailed descriptions thereof are omitted. Furthermore, since the configuration and operation of the common active load 210 made up of the two transistors MP1 and MP2 are also publicly known, the detailed descriptions thereof are omitted.

Figure 3:
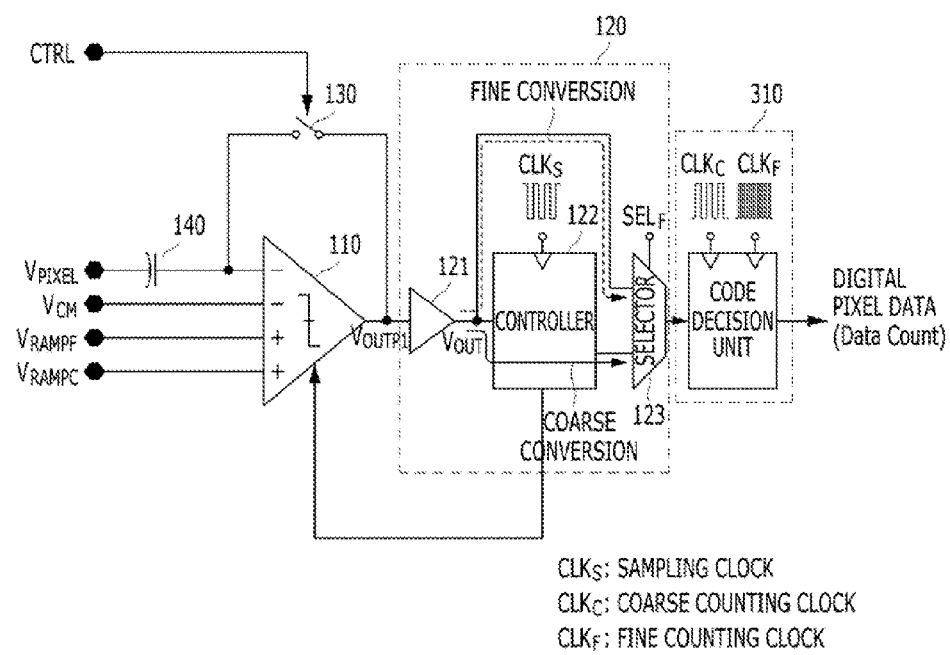
FIG. 3 is a block diagram illustrating an analog-to-digital converting apparatus in accordance with an embodiment of the present invention.

FIG. 3 is a block diagram of an analog-to-digital converting apparatus in accordance with an embodiment of the present invention.

As illustrated in FIG. 3, the analog-to-digital converting apparatus may include the comparator shown in FIG. 1 and a code decision unit 310.

The analog-to-digital converting apparatus in accordance with the embodiment of the present invention may include a preamplifier 110, a signal processor 120, and the code decision unit 310. The preamplifier 110 may block a coupling between output and input terminals by converting the output polarity of an output node, output a coarse conversion result through the output node by amplifying a difference between an input voltage $V_{PIXEL}$ and a coarse ramping voltage $V_{RAMPC}$, and output a fine conversion result through the output node by amplifying a difference between a fine ramping voltage $V_{RAMPF}$ and a common mode voltage $V_{CM}$. The signal processor 120 may generate a sampling control signal according to the coarse conversion result from the preamplifier 110, output the generated sampling control signal to the preamplifier 110, and output a comparison signal based on the coarse conversion result and the fine conversion result from the preamplifier 110 to a counter or line memory. The code decision unit 310 may determine a coarse digital code and a fine digital code according to the comparison signal from the signal processor 120, and output digital pixel data Dout.

The code decision unit 310 may determine a code using a coarse counting clock $CLK_C$ and a fine counting clock $CLK_F$. The code decision unit 310 may include a counter (up/down counter) and/or a line memory receiving a count value.

In accordance with the embodiments of the present invention, the cascode transistors may be inserted between the input node and the output node of the comparator to minimize a voltage variation of the drain node of the comparator input terminal. Furthermore, even when the comparator compares inputs, the cascode transistors may maintain a saturation state at all times such that a kickback to the input terminal does not occur. Therefore, a coupling between output and input terminals may be effectively removed.

Furthermore, as the coupling between output and input terminals is effectively removed, the linearity of the two-step single-slope ADC may be preserved.

Although various embodiments have been described for illustrative purposes, it will be apparent to those skilled in the art that various changes and modifications may be made without departing from the spirit and scope of the invention as defined in the following claims.

What is claimed is:

1. A preamplifier comprising:
a common active load suitable for providing output impedance;
an output polarity changing unit suitable for changing an output polarity of output nodes;
a multi-differential input stage suitable for receiving an input voltage, a coarse ramping voltage, a fine ramping voltage and a common mode voltage for differential amplification operations; and
a coupling blocking unit suitable for blocking a coupling between the output nodes and the multi-differential input stage.

2. The preamplifier of claim 1, further comprising an inverter suitable for inverting a comparator enable signal, and transmitting an inverted comparator enable signal to the coupling blocking unit.

3. The preamplifier of claim 2, wherein the inverter uses the same voltage as a power supply voltage.

4. The preamplifier of claim 1, wherein the output polarity changing unit comprises first and second switches suitable for setting a first output as an output at a reset point, and changing the output from the first output to a second output before a comparison operation.

5. The preamplifier of claim 1, wherein the output polarity changing unit outputs a high state signal during coarse conversion, and outputs a low state signal during fine conversion.

6. The preamplifier of claim 1, wherein the coupling blocking unit comprises first and second cascode transistors that operate in a saturation region until the input voltage is compared.

7. The preamplifier of claim 1, wherein the multi-differential input stage samples a common mode voltage and a coarse ramping voltage based on a sampling control signal.

8. The preamplifier of claim 7, wherein the sampled coarse ramping voltage and the sampled common mode voltage have a differential relationship for the preamplifier.

9. A comparator comprising:
a preamplifier suitable for blocking a coupling between output and input nodes by changing an output polarity of the output nodes, sampling a common mode voltage and a coarse ramping voltage based on a sampling control signal, generating a coarse conversion result through the output node by amplifying a difference between an input voltage and the sampled coarse ramping voltage, and generating a fine conversion result through the output nodes by amplifying a difference between a fine ramping voltage and the sampled common mode voltage; and a signal processor suitable for generating the sampling control signal based on the coarse conversion result, and generating a comparison signal based on the coarse conversion result and the fine conversion result.

10. The comparator of claim 9, wherein the preamplifier comprises:
   a common active load suitable for providing output impedance;
   an output polarity changing unit suitable for changing the output polarity of the output node;
   a multi-differential input stage suitable for receiving the input voltage, the coarse ramping voltage, the fine ramping voltage and the common mode voltage and sampling the common mode voltage and the coarse ramping voltage; and
   a coupling blocking unit suitable for blocking the coupling between the output nodes and the multi-differential input stage.

11. The comparator of claim 10, wherein the preamplifier further comprises an inverter suitable for inverting a comparator enable signal, and transmitting the inverted comparator enable signal to the coupling blocking unit.

12. The comparator of claim 11, wherein the inverter uses the same voltage as a power supply voltage.

13. The comparator of claim 10, wherein the coupling blocking unit comprises first and second switches suitable for setting a first output as an output at a reset point, and changing the output from the first output to a second output before a comparison operation.

14. The comparator of claim 10, wherein the output polarity changing unit outputs a high state signal during coarse conversion, and outputs a low state signal during fine conversion.

15. The comparator of claim 10, wherein the coupling blocking unit comprises first and second cascode transistors that operate in a saturation region until the input voltage is compared.

16. The comparator of claim 9, wherein the sampled coarse ramping voltage and the sampled common mode voltage have a differential relationship for the preamplifier.

17. The comparator of claim 9, wherein the signal processor comprises:
   an amplifier suitable for amplifying the coarse conversion result and the fine conversion result;
   a controller suitable for generating the sampling control signal based on the coarse conversion result; and
   a selector suitable for selecting the coarse conversion result through the controller and the fine conversion result from the amplifier based on a select signal to output the comparison signal.

18. The comparator of claim 9, wherein the signal processor comprises:
   a controller suitable for generating the sampling control signal based on the coarse conversion result; and
   a selector suitable for selecting the coarse conversion result through the controller and the fine conversion result from the preamplifier based on a select signal to output the comparison signal.

19. An analog-to-digital converting apparatus comprising:
   a preamplifier suitable for blocking a coupling between output and input nodes by changing an output polarity of the output nodes, sampling a common mode voltage and a coarse ramping voltage based on a sampling control signal, generating a coarse conversion result through the output nodes by amplifying a difference between an input voltage and the sampled coarse ramping voltage, and generating a fine conversion result through the output nodes by amplifying a difference between a fine ramping voltage and the sampled common mode voltage;
   a signal processor suitable for generating the sampling control signal based on the coarse conversion result, and generating a comparison signal based on the coarse conversion result and the fine conversion result; and
   a code decision unit suitable for deciding a coarse digital code and a fine digital code based on the comparison signal to output digital data.

20. The analog-to-digital converting apparatus of claim 19, wherein the preamplifier comprises:
   a common active load suitable for providing output impedance;
   an output polarity changing unit suitable for changing the output polarity of the output node;
   a multi-differential input stage suitable for receiving the input voltage, the coarse ramping voltage, the fine ramping voltage and the common mode voltage, and sampling the common mode voltage and the coarse ramping voltage; and
   a coupling blocking unit suitable for blocking the coupling between the output nodes and the multi-differential input stage.

* * * * *